(12) United States Patent
Weinstein et al.

(10) Patent No.: US 8,139,369 B2
(45) Date of Patent: Mar. 20, 2012

(54) PRINTED WIRING BOARD SOLDER PAD ARRANGEMENT

(75) Inventors: Jeremy F. Weinstein, Ithaca, NY (US); Robert M. Ward, Owego, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 392 days.

(21) Appl. No.: 12/102,169

(22) Filed: Apr. 14, 2008

(65) Prior Publication Data

US 2009/0258511 A1    Oct. 15, 2009

(51) Int. Cl.
*H05K 7/10* (2006.01)
(52) U.S. Cl. ........................... 361/767; 174/250
(58) Field of Classification Search .................. 174/250, 174/255, 260, 261, 262, 266, 534, 557; 257/737, 257/738, 747, 767, 768, 773, 774, 775, 777; 361/760, 761, 763, 764, 767, 768, 772
See application file for complete search history.

(56) References Cited

U.S. PATENT DOCUMENTS

| | | | |
|---|---|---|---|
| 4,775,917 A | 10/1988 | Eichhorn et al. | |
| 5,892,275 A | 4/1999 | McMahon | |
| 6,027,791 A | 2/2000 | Higashi et al. | |
| 6,083,045 A | 7/2000 | Chiu | |
| 6,115,262 A * | 9/2000 | Brunner et al. | 361/774 |
| 6,159,051 A | 12/2000 | Chang | |
| 6,225,573 B1 | 5/2001 | Nakamura | |
| 6,231,386 B1 | 5/2001 | Wu | |
| 6,280,247 B1 | 8/2001 | Wu et al. | |
| 6,320,139 B1 * | 11/2001 | Byle et al. | 174/261 |
| 6,511,347 B2 * | 1/2003 | Chapman et al. | 439/571 |
| 6,570,246 B1 | 5/2003 | Lee et al. | |
| 6,639,154 B1 * | 10/2003 | Cartier et al. | 174/255 |
| 6,667,557 B2 | 12/2003 | Alcoe et al. | |
| 7,045,392 B2 | 5/2006 | Hashimoto | |
| 7,081,019 B2 | 7/2006 | Ho et al. | |
| 7,084,353 B1 * | 8/2006 | Downes | 174/261 |
| 7,097,463 B2 | 8/2006 | Hsiao et al. | |
| 7,156,667 B2 | 1/2007 | Ge et al. | |
| 7,416,106 B1 * | 8/2008 | Downes et al. | 228/180.21 |
| 2003/0060062 A1 * | 3/2003 | Honda et al. | 439/67 |
| 2005/0059277 A1 | 3/2005 | Mao | |
| 2005/0116801 A1 | 6/2005 | Proehl et al. | |
| 2005/0264389 A1 | 12/2005 | Gallup et al. | |

FOREIGN PATENT DOCUMENTS

| | | |
|---|---|---|
| EP | 1624736 | 2/2006 |
| GB | 2284948 | 6/1995 |
| JP | 05267493 | 10/1993 |
| JP | 07058247 | 3/1995 |
| JP | 2004079776 | 3/2004 |

OTHER PUBLICATIONS

Thompson, T.B.; Subbarayan, G.; James, R.; and Renken, F.P., "A model for assessing the shape of solder joints in the presence of board warpage and volume variation in area-array packages", 2000 Intersociety Conference on Thermal Phenomena, pp. 405-414.
"Engineering productivity kit: fastening, joining, & assembly", Design News, Apr. 6, 1998, v. 53 [i.e. 54] No. 7, p. 109-18, retrieved from Wilson Applied Science and Technology database.

* cited by examiner

*Primary Examiner* — Yuriy Semenenko
(74) *Attorney, Agent, or Firm* — Michael Best & Friedrich LLP

(57) ABSTRACT

A printed wiring board includes solder pads to which component leads may be soldered. L-shaped solder pads of the printed wiring board allow component leads to approach the board from any of the four major sides of the printed wiring board. Each solder pad includes two legs and two respective axes. A component lead may be selectively soldered to one of the two legs of the solder pad. Thus, a component lead may approach a solder pad from one of four orthogonal directions.

24 Claims, 5 Drawing Sheets

PRINTED WIRING BOARD SOLDER PAD ARRANGEMENT

BACKGROUND

The present invention relates to printed wiring boards and solder pads for connecting component leads thereto.

SUMMARY

In one embodiment, the invention provides a printed wiring board defining a plane and having a first solder pad including a first solder member electrically connected to a second solder member. The first and second solder members include respective first and second longitudinal axes in the plane of the printed wiring board along either of which a first lead may be soldered. The first lead can be selectively connected to either the first solder member or the second solder member. The first and second longitudinal axes intersect at a first intersection point. The first solder member extends along the first longitudinal axis in a direction away from the first intersection. The second solder member extends along the second longitudinal axis in a direction away from the first intersection. The first and second longitudinal axes define an included angle therebetween, the included angle being between 45 and 135 degrees.

Other aspects of the invention will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings. Further still, a range defined as being "between" two given values also includes those given values.

Figure 1:
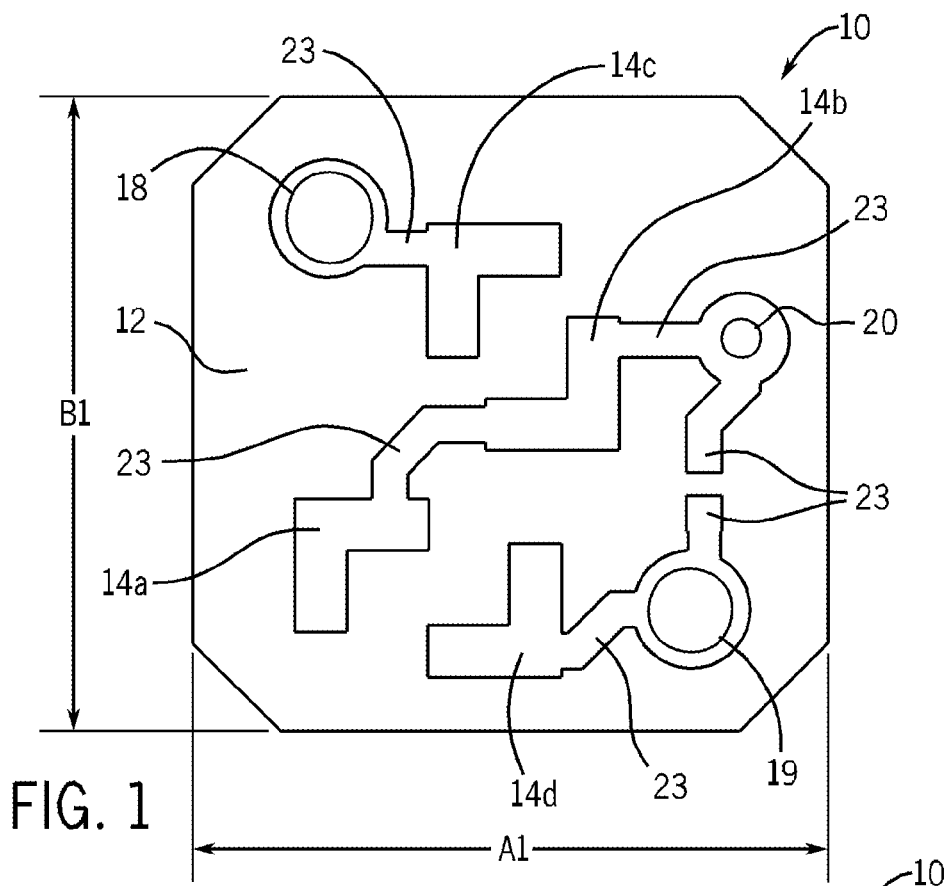
FIG. 1 is a top view of a printed wiring board having a solder pad arrangement.

FIG. 1 is a top view of the electrical connections on a printed wiring board 10 having overall dimensions A1, B1, a substrate 12 and first, second, third and fourth L-shaped solder pads 14a, 14b, 14c, 14d. The overall dimensions A1, B1 are approximately 0.25 inches each. Also shown are two apertures 18, 19 for grounds and an aperture 20 for a pin 22 (shown in FIG. 2). The first and second solder pads 14a, 14b are electrically connected to each other and to the pin 22 by way of electrical connections 23. The pin 22 is an electrical connector to a device and is inserted in the pin aperture 20 such that the pin 22 electrically connects with the first and second solder pads 14a, 14b, such as by soldering the pin in place. The pin 22 provides an electrical connection between the solder pads 14a, 14b and the device. The third and fourth solder pads 14c, 14d are each electrically connected to a screw 24 and 25 or other electrically conductive fastener that passes through apertures 18 and 19, respectively, to attach the printed wiring board to the device and to provide an electrical ground to the third and fourth solder pads 14c, 14d.

Figure 2:
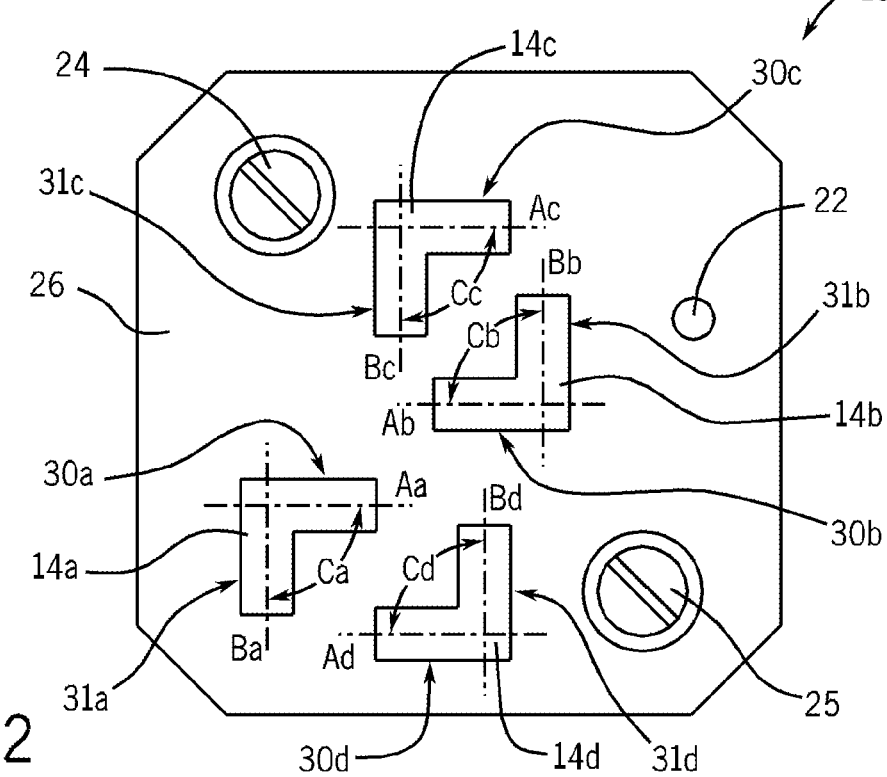
FIG. 2 is a top view of the printed wiring board of FIG. 1 having a solder mask.

FIG. 2 shows the printed wiring board having a solder mask 26, which covers and protects portions of the circuit shown in FIG. 1. Specifically, the solder mask 26 covers the substrate 12 and electrical connections 23 between the solder pads 14a through 14d, the screws 24, 25 and the pin 22. The L-shaped solder pads 14a through 14d remain exposed, allowing connections to be soldered thereto. Each solder pad 14a through 14d includes a respective first leg 30a, 30b, 30c, 30d or solder member and a respective second leg 31a, 31b, 31c, 31d or solder member. Each first leg 30a through 30d has a respective first longitudinal axis Aa, Ab, Ac, Ad which runs therethrough, and each second leg 31a through 31d has a respective second longitudinal axis Ba, Bb, Bc, Bd which runs therethrough. Solder legs 30a through 30d and 31a through 31d are generally elongated and extend in a direction away from the intersection of respective first longitudinal axes Aa, Ab, Ac, Ad with respective second longitudinal axes Ba, Bb, Bc, Bd. As shown in FIG. 2, each of the legs 30a through 30d and 31a through 31d have a rectangular shape, although they may have rounded corners or have another shape such as a polygon or ellipse.

Figure 3:
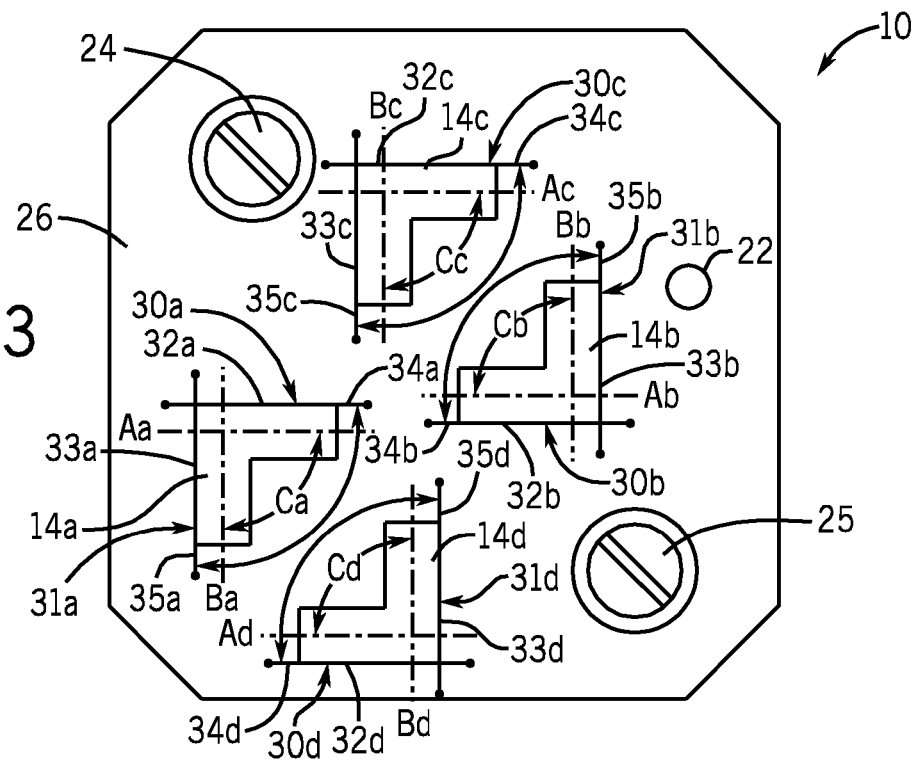
FIG. 3 is an additional top view of the printed wiring board of FIG. 2 including further detail.

FIG. 3 shows an additional top view of the printed wiring board 10 showing line segments of the solder pads. Referring to the first solder pad 14a, each solder leg 30a, 31a includes a respective first and second edge 32a, 33a defined by a respective first and second line segment 34a, 35a. The first and second lines segments 34a, 35a intersect each other, forming an included angle of between 45 and 135 degrees. More preferably, the included angle is between 60 and 120 degrees. Most preferably, the included angle is substantially equal to 90 degrees. In a preferred construction, the first line segment 34a is parallel to the first axis Aa and the second line segment 35a is parallel to the second axis Ba, as shown. The description of the first solder pad 14a above can also be applied to the respective parts of the other three solder pads 14b, 14c, 14d, as shown in FIG. 3.

A lead wire may be soldered to each solder pad 14a through 14d along one of the respective axes Aa through Ad or Ba through Bd. The axes Aa through Ad and Ba through Bd lie in a plane defined by the printed wiring board 10. It is to be understood that all four solder pads 14a through 14d can be described in the same way; therefore, any description of one solder pad and its respective axes, angles and other features may be extended to the remaining solder pads and their respective axes, angles and other features. However, it is not necessary for all solder pads on the same printed wiring board to be the same.

The axes Aa, Ba of a single solder pad 14a have an included angle Ca therebetween. Accordingly, the remaining solder pads 14b through 14d have respective included angles Cb through Cd between their respective axes. Each respective included angle Ca through Cd may be between 45 and 135 degrees. Preferably, the included angles Ca through Cd are between 60 and 120 degrees. More preferably, the included angles Ca through Cd are substantially 90 degrees, as shown in FIG. 2. Each included angle Ca through Cd need not be the same.

Figure 4:
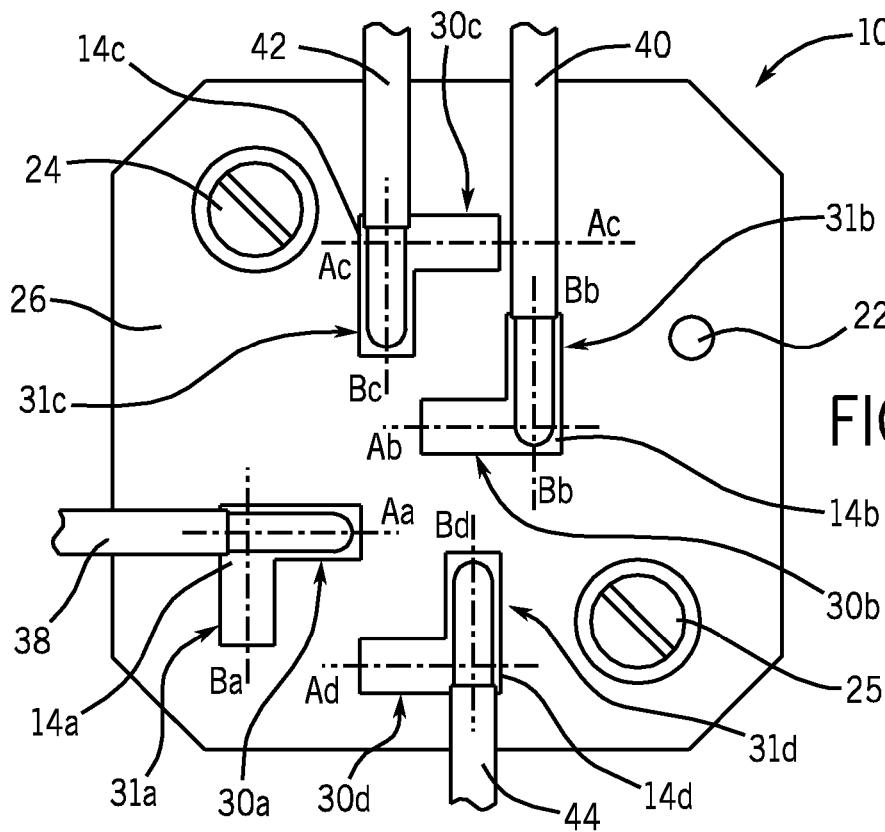
FIG. 4 is a top view of the printed wiring board of FIG. 2 having wires soldered thereto.

FIG. 4 shows the printed wiring board 10 having first and second power wires 38, 40, respectively, and first and second ground wires 42, 44, respectively. An uninsulated portion of the first power wire 38 is soldered to the first solder pad 14a parallel to and preferably coincident with one of the longitudinal axes Aa or Ba. Whether longitudinal axis Aa or Ba is selected depends on the direction from which the wire 38 comes from. As shown in FIG. 4, longitudinal axis Aa was selected. An uninsulated portion of the second power wire 40 is soldered to the second solder pad 14b parallel to and preferably coincident with one of the longitudinal axes Ab or Bb. As shown in FIG. 4, longitudinal axis Bb was chosen. However, it is possible to solder two power wires 38 and 40 to a single solder pad 14a or 14b—one wire 38 along axis Aa and one wire 40 along axis Ba, for example. An uninsulated portion of the first ground wire 42 is soldered to the third solder pad 14c parallel and preferably coincident with one of the longitudinal axes Ac or Bc, and an uninsulated portion of the second ground wire 44 is soldered to the fourth solder pad 14d parallel to and preferably coincident with one of the longitudinal axes Ad or Bd. Similarly, it is possible to solder two ground wires 42 and 44 to a single solder pad 14c or 14d, which is illustrated in FIG. 5.

Thus, the L-shaped solder pads 14a through 14d provide a mounting surface that can be approached by the wires 38, 40, 42, 44 from all four major directions (top, bottom, right, left). Each wire 38, 40, 42, 44 can be soldered to the board 10 from any of the board's major sides (corresponding to the four major directions) and be securely soldered to the board 10, reducing the overall amount of space and material required by eliminating large twists and turns of wire.

Furthermore, the printed wiring board 10 may be attached to the device in any orientation and still provide similar functionality. As shown in FIG. 5, multiple printed wiring boards 10 are attached to the device—in this case, a hermetically-sealed hybrid microcircuit 46 which includes an amplifier. Recesses 50 formed on the back of the hybrid microcircuit device 46 accommodate the printed wiring boards 10, and channels 54 accommodate lead wires 38, 40, ground wires 42, 44, or other connecting wires. Since this single printed wiring board design 10 has similar functionality when mounted in any direction—hereafter referred to as its "functional symmetry"—only one printed wiring board design need be manufactured for several different applications.

Figure 5:
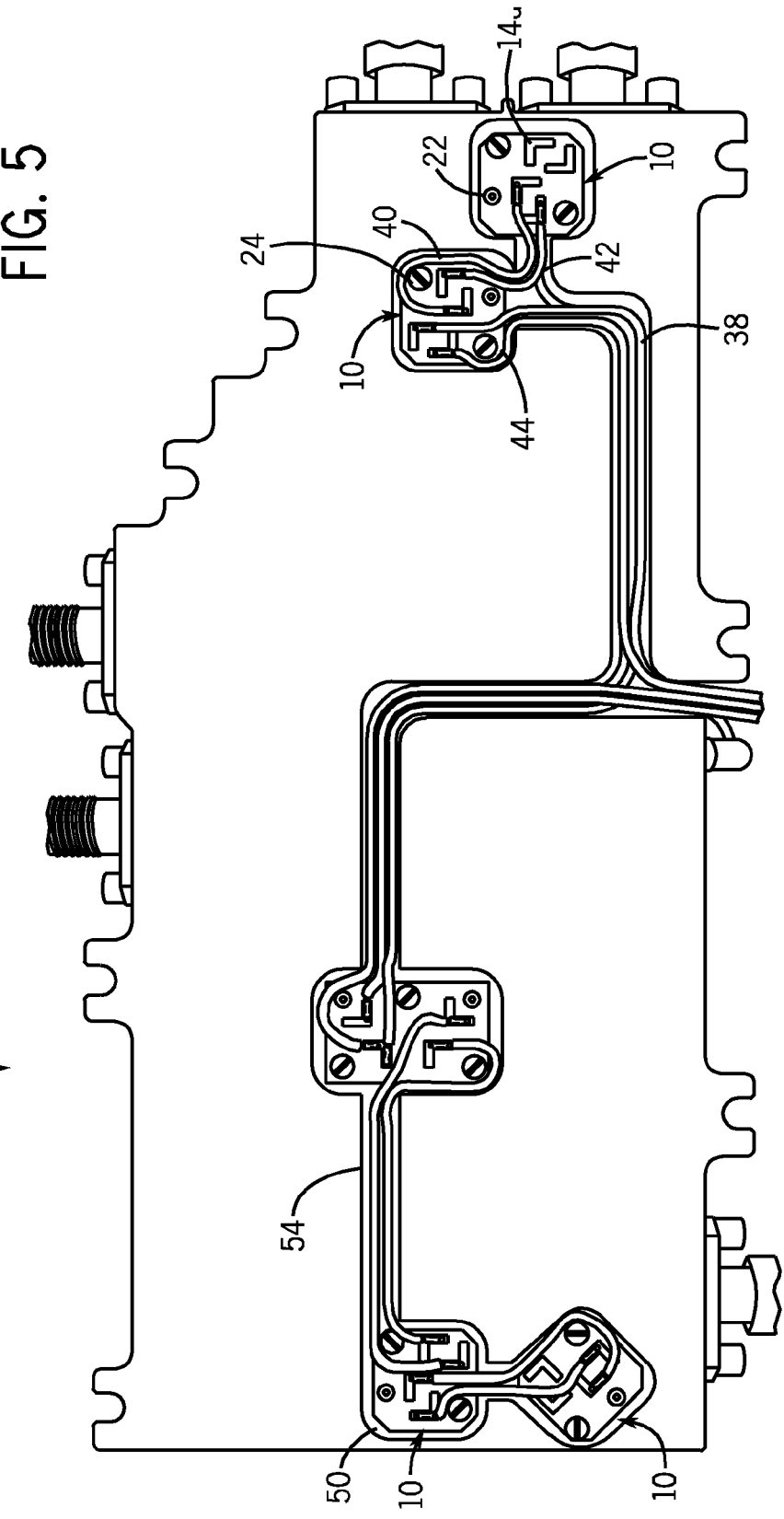
FIG. 5 is a bottom view of a hermetically sealed hybrid microcircuit device having printed wiring boards according to the present invention.

With further reference to FIG. 5, each printed wiring board 10 provides power to an amplifier or other circuit inside the hermetically sealed device 46 by way of the pin 22, which extends from the device 46 through the pin aperture 20 in the printed wiring board substrate 12 and is electrically connected to the power wires 38, as shown in FIG. 4. Also note that the wires 38, 40, 42, 44 need not cross on the printed wiring board 10.

Figure 6:
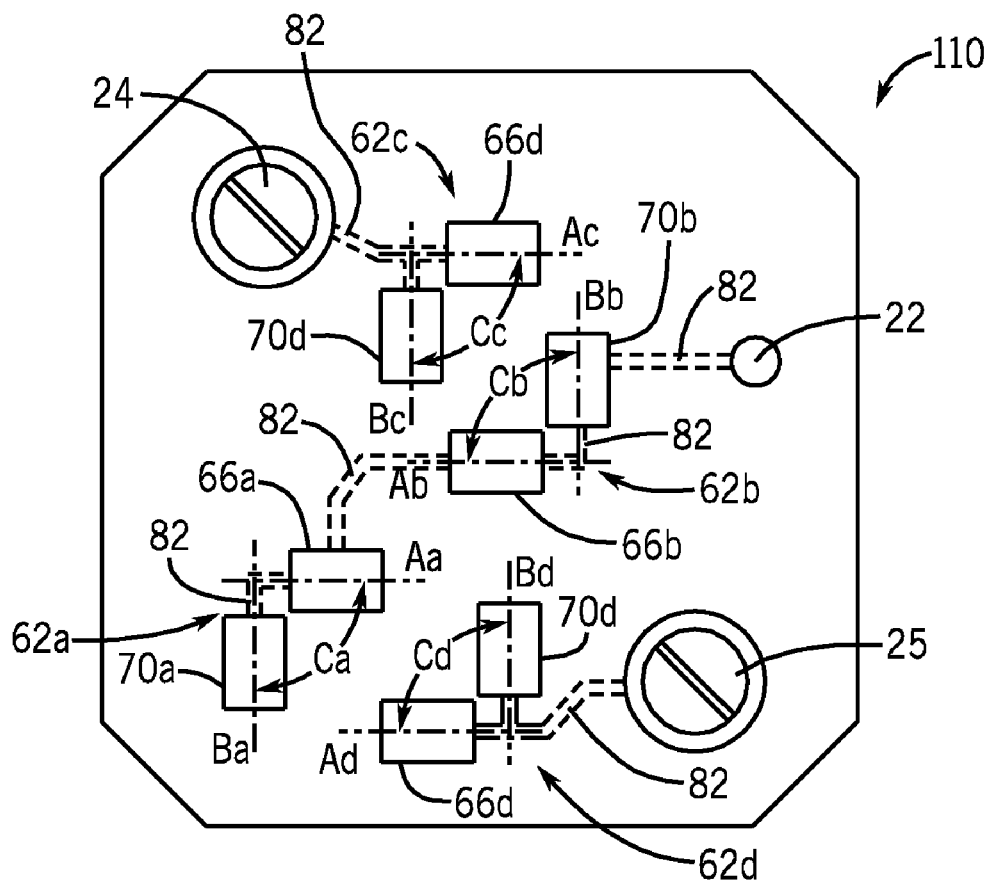
FIG. 6 is a top view of an alternate construction of the printed wiring board of FIG. 3.
Figure 7:
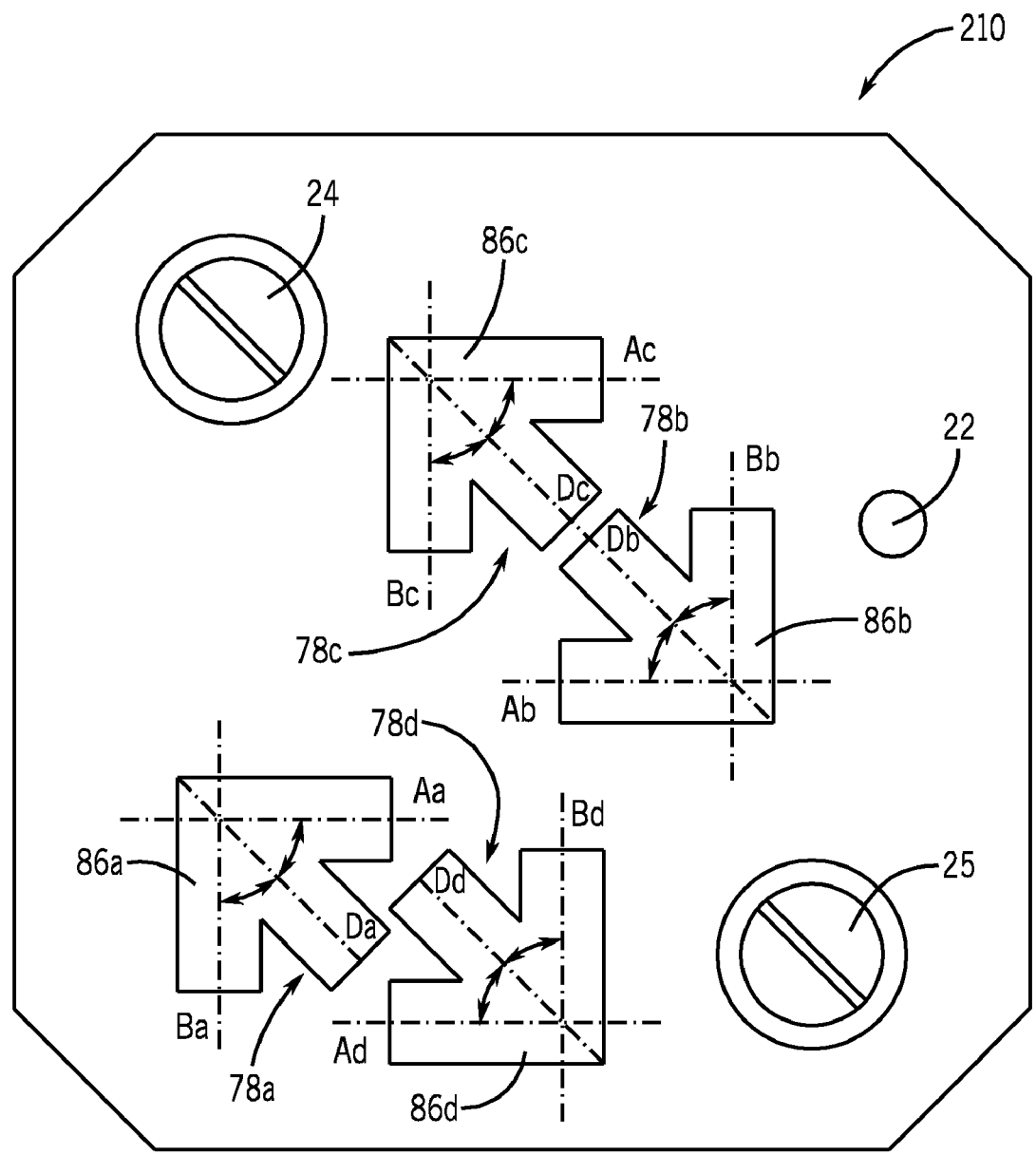
FIG. 7 is a top view of an alternate construction of the printed wiring board of FIG. 3.

FIGS. 6 and 7 illustrate alternate constructions of the present invention. Many solder pad shapes may provide the same functional symmetry as the L-shaped solder pads 14a through 14d illustrated in FIGS. 1-5.

FIG. 6 shows one alternative construction of a printed wiring board 110 including first, second, third and fourth solder pads 62a, 62b, 62c, 62d, respectively, having respective first legs 66a, 66b, 66c, 66d and respective second legs 70a, 70b, 70c, 70d. In this alternative construction, the first legs 62a through 62d are physically separate from the respective second legs 70a through 70d, although they are still electrically connected beneath the solder mask 26 by way of electrical connections 82 (shown in phantom). The remaining description remains unchanged from the construction of the printed wiring board 10 shown in FIG. 1. The first and second solder pads 62a, 62b are electrically connected to one another and to the pin 22, the third solder pad 62c is electrically connected to ground, the fourth solder pad 62d is also electrically connected to ground, and the respective longitudinal axes of each leg 66a through 66d and 70a through 70d have respective angles Ca through Cd included therebetween, as described above. However, the included angles Ca through Cd in FIG. 6 fall into the same ranges described above but may have different values from the angles Ca through Cd in FIG. 2.

The solder pads 14a through 14d and 62a through 62d need not be limited to having two legs and two axes each. FIG. 7 shows another alternative construction of a printed wiring board 210 having solder pads 86a through 86d, which is similar to the printed wiring board 10 as described above except that solder pads 86a through 86d also include respective third legs 78a, 78b, 78c, 78d and respective third longitudinal axes Da, Db, Dc, Db along each of which a respective wire may be soldered. The additional third legs 78a through 78d preferably are placed within the respective included angles Ca through Cd, as shown. Because axes Da through Dd subtend angles Ca through Cd respectively, axes Da through Dd create an additional pair of included angles with respective axes Aa through Ad and with respective axes Ba through Bd (e.g., included angles Aa-Da and Ba-Da for solder pad 86a). The sum of each additional pair of angles equals the value of the respective included angle Ca through Cd.

Other constructions of the solder pad that allow a wire to be selectively soldered to the solder pad at one of a plurality of angles lying within the plane of the printed wiring board are also possible. Alternate solder pad shapes that include a first axis Aa through Ad and a second axis Ba through Bd along which a lead wire may be soldered to the solder pad could be used instead of (or in addition to) the L-shaped solder pad and the variations thereof shown in FIGS. 1-7. Some such possible solder pad shapes include a circle, an ellipse, a square, a rectangle, a plus-sign, a "T" and other polygons having the axes described above, being capable of accommodating a wire to be soldered thereto, and being capable of placement on a printed wiring board.

Thus, the invention provides, among other things, a printed wiring board having solder pads to which leads and grounds may approach from any of the four major sides of the board and be soldered securely thereto. Various aspects of the invention are set forth in the following claims.

What is claimed is:

1. A printed wiring board defining a plane, comprising:
a first solder pad configured to receive a first lead oriented substantially parallel to the plane;
the first solder pad including an electrically connected portion having a first aperture therethrough configured to receive a pin from a device in an orientation substantially perpendicular to the first lead to electrically connect the first lead to the pin;

the first solder pad including a first solder member including a first axis in the plane of the printed wiring board, such that the first lead may be soldered to the first solder pad along the first axis;

the first solder pad including a second solder member electrically connected to the first solder member and including a second axis in the plane of the printed wiring board, the second axis intersecting the first axis at a first intersection, each of the first solder member and the second solder member extending in a direction away from the first intersection, such that the first lead may alternatively be soldered to the first solder pad along the second axis;

a first included angle between the first axis and the second axis of between 45 and 135 degrees;

a second solder pad electrically separate from the first solder pad, the second solder pad configured to receive a second lead oriented substantially parallel to the plane of the printed wiring board such that the second lead is soldered to the second solder pad in said orientation;

the second solder pad including an electrically connected portion having a second aperture therethrough configured to receive a mechanical fastener in an orientation substantially perpendicular to the second lead for fastening the printed wiring board to the device and for providing an electrical ground to the second lead;

the second solder pad including a third solder member including a third axis in the plane of the printed wiring board, such that the second lead may be soldered to the second solder pad along the third axis;

the second solder pad including a fourth solder member electrically connected to the third solder member and including a fourth axis in the plane of the printed wiring board, the fourth axis intersecting the third axis at a second intersection, each of the third solder member and the fourth solder member extending in a direction away from the first intersection, such that the second lead may alternatively be soldered to the second solder pad along the fourth axis; and a second included angle between the third axis and the fourth axis of between 45 and 135 degrees;

wherein the first solder member and the second solder member are physically connected to each other; and wherein the third solder member and the fourth solder member are physically connected to each other.

2. The printed wiring board of claim 1, wherein the first solder member and the second solder member are physically spaced apart from each other.

3. The printed wiring board of claim 1, wherein the first solder member includes a first edge that lies in a first line segment, the second solder member includes a second edge that lies in a second line segment, and the first and second line segments intersect to form a line segment included angle of between 45 and 135 degrees.

4. The printed wiring board of claim 3, wherein the line segment included angle is between 60 and 120 degrees.

5. The printed wiring board of claim 4, wherein the line segment included angle is substantially equal to 90 degrees.

6. The printed wiring board of claim 1, wherein the first and second solder members are elongated.

7. The printed wiring board of claim 1, wherein the first axis and the second axis are longitudinal axes of the first solder member and the second solder member, respectively.

8. The printed wiring board of claim 1, further comprising a third solder pad electrically connected to the first solder pad and configured to enable a third lead to be soldered thereto.

9. The printed wiring board of claim 1, wherein the first solder member has the shape of a first polygon and the second solder member has the shape of a second polygon.

10. The printed wiring board of claim 1, wherein the first included angle is between 60 and 120 degrees.

11. The printed wiring board of claim 10, wherein the first included angle is substantially equal to 90 degrees.

12. The printed wiring board of claim 8, wherein the third solder pad includes:
    a fifth solder member including a fifth axis in the plane of the printed wiring board, such that the third lead may be soldered to the third solder pad along the fifth axis;
    a sixth solder member electrically connected to the fifth solder member and including a sixth axis in the plane of the printed wiring board, the sixth axis intersecting the fifth axis at a third intersection, each of the fifth solder member and the sixth solder member extending in a direction away from the third intersection, such that the third lead may alternatively be soldered to the third solder pad along the sixth axis; and
    a third included angle between the fifth axis and the sixth axis of between 45 and 135 degrees.

13. The printed wiring board of claim 12, wherein the fifth axis and the sixth axis are longitudinal axes of the fifth solder member and the sixth solder member, respectively.

14. The printed wiring board of claim 12, wherein the third included angle is between 60 and 120 degrees.

15. The printed wiring board of claim 14, wherein the third included angle is substantially equal to 90 degrees.

16. The printed wiring board of claim 14, wherein the first included angle is between 60 and 120.

17. The printed wiring board of claim 15, wherein the first included angle is substantially equal to 90 degrees.

18. The printed wiring board of claim 12, further including a fourth solder pad configured to provide an electrical ground, comprising:
    a seventh solder member including a seventh axis in the plane of the printed wiring board, such that a fourth lead may be soldered to the fourth solder pad along the seventh axis;
    an eighth solder member electrically connected to the seventh solder member and including an eighth axis in the plane of the printed wiring board, the eighth axis intersecting the seventh axis at a fourth intersection, each of the seventh solder member and the eighth solder member extending in a direction away from the fourth intersection, such that the fourth lead may alternatively be soldered to the fourth solder pad along the eighth axis; and
    a fourth included angle between the seventh axis and the eighth axis of between 45 and 135 degrees.

19. The printed wiring board of claim 18, wherein the fourth included angle is between 60 and 120 degrees, and the third included angle is between 60 and 120 degrees.

20. The printed wiring board of claim 18, wherein the fourth included angle is substantially equal to 90 degrees, the third included angle is substantially equal to 90 degrees, the second included angle is substantially equal to 90 degrees, and the first included angle is substantially equal to 90 degrees.

21. The printed wiring board of claim 1, wherein the first solder pad further includes a ninth solder member electrically connected to the first solder member and the second solder member, and including a ninth axis in the plane of the printed wiring board, such that the first lead may alternatively be soldered to the first solder pad along the ninth axis.

22. The printed wiring board of claim 21, wherein the ninth solder member is disposed between the first and second solder members.

23. The printed wiring board of claim 1, further comprising:
- a substantially planar substrate defining a first side and a second side opposite the first side, wherein the first side of the substrate is configured to be placed on the device, wherein the first and second solder pads are positioned on the second side;
- a first lead received by the first solder pad from the second side and soldered to the first solder pad substantially parallel to the plane and parallel to the first axis; and
- a second lead received by the second solder pad from the second side and soldered to the second solder pad substantially parallel to the plane and parallel to the third axis.

24. The printed wiring board of claim 1, further comprising:
- a substantially planar substrate defining a first side and a second side opposite the first side, wherein the first and second solder pads are positioned on the second side, and wherein the printed wiring board is coupled to the device such that the first side of the substrate faces the device.

* * * * *